(12) United States Patent
Hattori et al.

(10) Patent No.: US 7,915,630 B2
(45) Date of Patent: Mar. 29, 2011

(54) SEMICONDUCTOR LIGHT-EMITTING DEVICE

(75) Inventors: Yasushi Hattori, Kawasaki (JP); Shinji Saito, Yokohama (JP); Shinya Nunoue, Ichikawa (JP); Eiji Muramoto, Kawasaki (JP); Koichi Tachibana, Kawasaki (JP); Saori Abe, Tokyo (JP); Jongil Hwang, Kawasaki (JP); Maki Sugai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/408,810

(22) Filed: Mar. 23, 2009

(65) Prior Publication Data

US 2009/0185589 A1 Jul. 23, 2009

Related U.S. Application Data

(63) Continuation of application No. PCT/JP2008/073881, filed on Dec. 19, 2008.

(30) Foreign Application Priority Data

Dec. 25, 2007 (JP) ................. 2007-333300

(51) Int. Cl.
*H01L 33/00* (2010.01)
(52) U.S. Cl. ............ 257/98; 257/99; 257/790; 257/100; 257/79
(58) Field of Classification Search .................... 257/98, 257/99, 100, 790, 79
See application file for complete search history.

(56) References Cited

U.S. PATENT DOCUMENTS

| | | | | |
|---|---|---|---|---|
| 6,982,522 | B2* | 1/2006 | Omoto | 313/502 |
| 2004/0066140 | A1 | 4/2004 | Omoto | |
| 2005/0051790 | A1 | 3/2005 | Ueda | |
| 2006/0139926 | A1* | 6/2006 | Morioka et al. | 362/260 |
| 2006/0291246 | A1 | 12/2006 | Hattori et al. | |
| 2007/0228390 | A1 | 10/2007 | Hattori et al. | |
| 2008/0080185 | A1* | 4/2008 | Kumagai et al. | 362/259 |
| 2008/0169752 | A1 | 7/2008 | Hattori et al. | |

FOREIGN PATENT DOCUMENTS

| | | |
|---|---|---|
| FR | 2 886 055 | 11/2006 |
| JP | 64-12300 | 1/1989 |
| JP | 2005-205195 | 8/2005 |
| JP | 2006-73202 | 3/2006 |
| JP | 2006-210887 | 8/2006 |
| JP | 2007-294754 | 11/2007 |
| JP | 2008-108553 | 5/2008 |

OTHER PUBLICATIONS

U.S. Appl. No. 12/729,636, filed Mar. 23, 2010, Hattori, et al.
U.S. Appl. No. 12/638,354, filed Dec. 15, 2009, Hashimoto, et al.
U.S. Appl. No. 12/874,788, filed Sep. 2, 2010, Saito, et al.
U.S. Appl. No. 12/876,675, filed Sep. 7, 2010, Hattori, et al.
U.S. Appl. No. 12/876,774, filed Sep. 7, 2010, Hattori, et al.
U.S. Appl. No. 12/876,738, filed Sep. 7, 2010, Hattori, et al.

\* cited by examiner

*Primary Examiner* — Long Pham
(74) *Attorney, Agent, or Firm* — Oblon, Spivak, McClelland, Maier & Neustadt, L.L.P.

(57) ABSTRACT

A light-emitting device which includes a semiconductor light-emitting element, and a plurality of plate-like wavelength conversion members which are disposed to face the semiconductor light-emitting element and are inclined with respect to the optical axis of excitation light emitted from the semiconductor light-emitting element, the plate-like wavelength conversion members containing respectively a fluorescent material which is capable of absorbing the excitation light and outputting light having a different wavelength from that of the excitation light, and the plate-like wavelength conversion members as a whole emitting visible light.

13 Claims, 6 Drawing Sheets

SEMICONDUCTOR LIGHT-EMITTING DEVICE

CROSS REFERENCE TO RELATED APPLICATIONS

This is a Continuation Application of PCT Application No. PCT/JP2008/073881, filed Dec. 19, 2008, which was published under PCT Article 21(2) in English.

This application is based upon and claims the benefit of priority from prior Japanese Patent Application No. 2007-333300, filed Dec. 25, 2007, the entire contents of which are incorporated herein by reference.

BACKGROUND OF THE INVENTION

1. Field of the Invention

This invention relates to a light-emitting device, in particular, to the light-emitting device which is provided with a semiconductor light-emitting element and with a wavelength conversion member containing a phosphor.

2. Description of the Related Art

Various kinds of light source devices or light-emitting devices have been proposed, wherein a semiconductor light-emitting element and a fluorescent substance are combined (see for example, JP-A 2005-205195; JP-A 2006-210887; JP-A 2006-73202). Light-emitting devices of this kind are designed such that the fluorescent substance is enabled to absorb excitation light emitted from the semiconductor light-emitting element and to emit light having a different wavelength from that of the excitation light.

A light-emitting device, which is excellent in luminescence and color rendering, is disclosed in JP-A 2005-205195. This light-emitting device employs an optical fiber as an optical waveguide of the excitation light and is constructed such that the optical fiber is provided at its distal end with a fluorescent substance.

JP-A 2006-210887 describes a light-emitting device which is excellent in light extracting efficiency, this light-emitting device being provided with a semiconductor light-emitting element which is capable of emitting excitation light and with a dispersion having phosphor particles dispersed therein. In this light-emitting device, the light to be emitted from the phosphor particles in the dispersion is extracted from the excitation light incidence side of the dispersion.

Further, JP-A 2006-73202 describes a light-emitting device for illumination, which is provided with a semiconductor laser element outputting a laser beam and with a light-guiding plate having a light extracting surface coated with a phosphor and surface-emitting a light.

These light-emitting devices described in these patent publications however are accompanied with the following problems. Namely, in the cases of the light-emitting devices described in JP-A 2005-205195 and JP-A 2006-210887, the excitation light is concentrated at one point of the phosphor, creating a point light source exhibiting high brightness and increasing excitation density, thereby raising various problems such as the decrease of light-emitting efficiency and the deterioration of materials. On the other hand, in the case of the light-emitting device described in JP-A 2006-73202, although it is possible to make lower the excitation density and to realize a surface light-emitting source, the structure thereof essentially includes a light-guiding plate and a cylindrical lens, thus making it a complicated structure requiring a large number of optical parts.

Furthermore, in order to effectively suppress the leakage of excitation light in these light-emitting devices constructed as described above, the thickness of the phosphor thereof required to be increased. As a result, the resorption and scattering of light are caused to increase inside the phosphor, thereby deteriorating the luminous efficiency.

Additionally, since it is impossible to increase the excitation density, a light-emitting device which is capable of outputting a high energy beam cannot be utilized, so that these light-emitting devices cannot be applied to an apparatus requiring a high luminous flux such as a lighting apparatus, an image display apparatus, etc.

It is an object of the present invention to provide a light-emitting device which is low in energy loss due to resorption, has a large light emitting area, can utilize a exited light of a high energy, and can output a visible light of a high luminous flux.

BRIEF SUMMARY OF THE INVENTION

According to a first aspect of the present invention, there is provided a light-emitting device which comprises a semiconductor light-emitting element emitting an excitation light along an optical axis; and a plurality of plate-like wavelength conversion members which are disposed to face the semiconductor light-emitting element along the optical axis, and are inclined with respect to the optical axis, each plate-like wavelength conversion member containing a fluorescent material which is capable of absorbing the excitation light and outputting a visible light having a different wavelength from that of the excitation light.

DETAILED DESCRIPTION OF THE INVENTION

Various embodiments of the present invention will be explained with reference to drawings. In the explanation of the following drawings, the same or similar portions are represented by the same or similar reference numbers or symbols.

Figure 1:
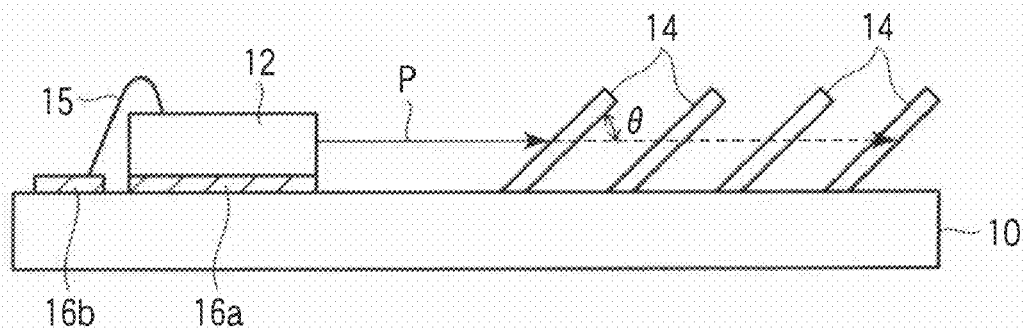
FIG. 1 is a diagram illustrating a light-emitting device according to one embodiment of the present invention.

As shown in FIG. 1, the light-emitting device according to one embodiment of the present invention is constructed such that a light-emitting element 12 and a plurality (four in this drawing) of wavelength conversion members 14 are arranged on the surface of a base 10. The base 10 is provided, on the surface thereof, with wiring layers 16a and 16b. One of the electrodes (not shown) of the light-emitting element 12 is directly electrically connected to the wiring layer 16a and the other electrode is electrically connected, via a bonding wire 15, to the wiring layer 16b.

The wavelength conversion members 14 are inclined with respect to the optical axis P of excitation light to be emitted from the light-emitting element 12. The angle θ of the wavelength conversion members 14 to the optical axis P should preferably be confined to 30° to less than 90°, more preferably 30° to 60°, most preferably 45°.

When this angle θ is less than 30°, the excitation light to be emitted from the light-emitting element 12 may not easily come into the wavelength conversion members 14, thus deteriorating the light extracting efficiency. When this angle θ is 90° or more, it may become difficult to extract the light.

It should be noted that on the plane parallel with the base 10, the wavelength conversion members 14 are disposed perpendicular to the optical axis P.

Further, the wavelength conversion members 14 are disposed at such intervals that one wavelength conversion member 14 and the brightest point of excitation light in another wavelength conversion member 14, which is behind neighboring to one wavelength conversion member, is prevented from being overlapped in a light extraction direction (in vertical direction). If the preceding wavelength conversion member is caused to overlap, in vertical direction, with the light-emitting point of a succeeding wavelength conversion member, the light from the light-emitting point of the succeeding wavelength conversion member would be obstructed by the preceding wavelength conversion member, thereby making it difficult to effectively extract the light.

Figure 2:
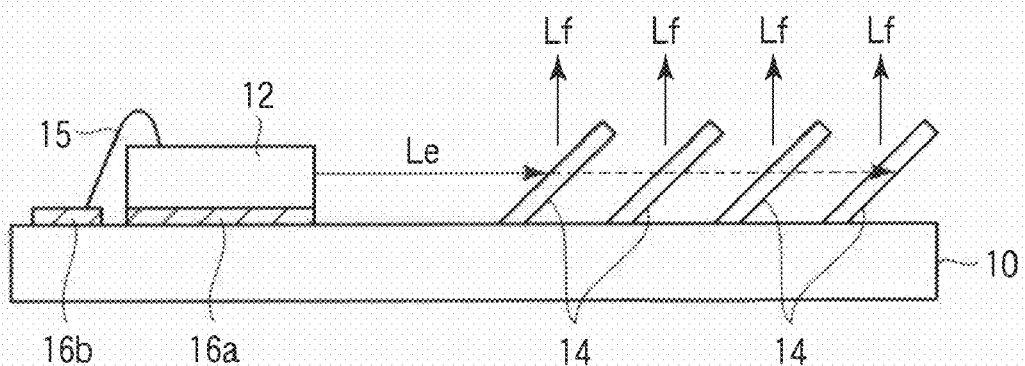
FIG. 2 is a diagram illustrating the light extraction mechanism of the light-emitting device according to one embodiment of the present invention.

As shown in FIG. 2, the excitation light Le ranging from ultraviolet rays to visible radiation is irradiated from the light-emitting element 12 to the first wavelength conversion members 14. As a result, this first wavelength conversion member 14 is enabled to absorb part of the excitation light and to isotropically irradiate the visible light. The visible light thus irradiated is then enabled to output as outgoing visible light Lf from this first wavelength conversion member 14 to the external region.

The excitation light passed through the first wavelength conversion member 14 is then irradiated to the second wavelength conversion member 14. As a result, part of the excitation light is absorbed by this second wavelength conversion member 14 and remainder of the excitation light is enabled to pass through this second wavelength conversion member 14. This process is repeated, thus enabling each of the wavelength conversion members 14 to output outgoing visible light. Thus, this process is repeated a number of times corresponding to the number of the wavelength conversion members, thus enabling the excitation light to be absorbed by the first, second, third and fourth wavelength conversion members 14.

Further, a film which is capable of reflecting ultraviolet rays as well as visible light may be disposed immediately behind the wavelength conversion member 14 which is located furthest from the light-emitting element 12 among the wavelength conversion members 14.

Figure 3:
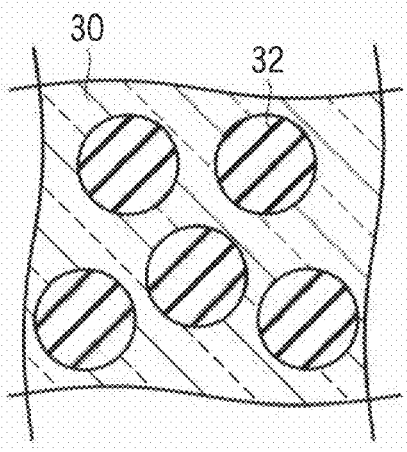
FIG. 3 is a cross-sectional view illustrating a portion of the phosphor of the light-emitting device shown in FIG. 1.

FIG. 3 illustrates a portion of the cross-section of the wavelength conversion member 14. As shown in FIG. 3, the wavelength conversion member 14 includes a transparent medium 30 and phosphor particles 32 dispersed in the transparent medium 30. The excitation light that has been introduced into the interior of the wavelength conversion member 14 is absorbed by the phosphor particles 32. Part of the excitation light is enabled to pass through the transparent medium 30. The excitation light that has passed through the transparent medium 30 is irradiated to the next wavelength conversion member 14 in which the absorption and permeation of the excitation light are repeated in the same manner as in the preceding wavelength conversion member 14. This process is repeated a number of times corresponding to the number of the wavelength conversion members.

Therefore, even if excitation light Le of high energy is emitted from the light-emitting element 12, the excitation light irradiated to the wavelength conversion members 14 can be gradually absorbed by each of the wavelength conversion members 14, the excitation light Le can be utilized at a low excitation density. Furthermore, the thickness of each of the wavelength conversion members 14 can be decreased to the minimum and the substantial optical path length of the visible light that has emitted from the phosphor particles 32 can be shortened, thereby making it possible to minimize the resorption coefficient. As a result, it is now possible to output the outgoing visible light of high luminous flux at a high efficiency.

The content of the phosphor particles 32 in the transparent medium 30 may be adjusted in such a manner that the excitation light emitted from the light-emitting element 12 can be effectively absorbed and permeated. Specifically, the wavelength conversion members 14 may be constructed such that the phosphor particles 32 are contained in the transparent medium 30 at a ratio of about 5-75% by weight, more preferably about 25% by weight. Further, as for the phosphor particles 32, the particle diameter thereof may be confined to 5-25 μm. Especially, it is possible to use the phosphor particles 32 containing large particles having, for example, a particle diameter of 20 nm or more which are excellent in emission intensity and in emission efficiency.

It has been found as a result of the experiments conducted by the present inventors that the thickness and number of wavelength conversion member and the concentration of the phosphor in the wavelength conversion member (weight of phosphor/weight of wavelength conversion member) are related with the excitation light. Namely, the intensity I of the light that cannot be absorbed by the phosphor (the light that cannot be utilized as luminous light) among the excitation light emitted from the light-emitting element 12 can be represented by the following equation.

$$I = I_0 e^{Kctn}$$

$I_0$: Intensity of excitation light;
K: Coefficient
C: Concentration (weight %) of the phosphor in the wavelength conversion member;
t: Thickness (μm) of the wavelength conversion member;
n: Number of the wavelength conversion member.

Figure 4:
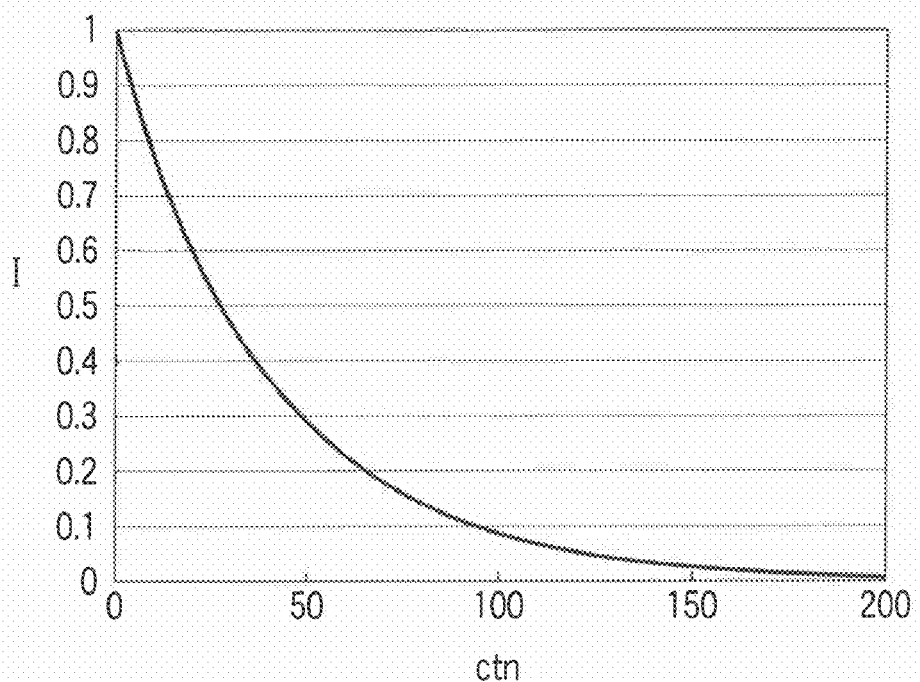
FIG. 4 is a graph illustrating the relationships of the thickness and number of wavelength conversion member and of the concentration of the phosphor in the wavelength conversion member relative to the intensity of the light that could not be absorbed by the phosphor.

FIG. 4 shows a graph wherein ctn is plotted on the abscissa and I is plotted on the ordinate.

It will be recognized from FIG. 4 that if the ctn is set to about 100 so as to confine the light that cannot be absorbed by the wavelength conversion member (leakage light) to no more than 10%, it requires four wavelength conversion members each having a thickness of 100 μm as the concentration of phosphor is set to 25% by weight or it requires four wavelength conversion members each having a thickness of 50 μm as the concentration of phosphor is set to 50% by weight.

With respect to specific examples of the light-emitting element 12, it is possible to employ those having an emission peak wavelength ranging from blue to ultraviolet in a wavelength region of no more than about 430 nm. The light-emitting element 12 may be an edge-emitting type or a surface emission type. More specifically, it is possible to employ a semiconductor laser diode or a light-emitting diode, wherein a III-V group compound semiconductor such as aluminum/gallium/indium nitride (AlGaInN) or a II-VI group compound semiconductor such as magnesium/zinc oxide (MgZnO) is used as a light-emitting layer (active layer).

For example, the III-V group compound semiconductor to be used as a light-emitting layer includes a nitride semiconductor containing at least one metal selected from the group consisting of Al, Ga and In. This nitride semiconductor can be specifically represented by $Al_xGa_yIn_{(1-x-y)}$ ($0 \leq x \leq 1$, $0 \leq y \leq 1$, $0 \leq (x+y) \leq 1$).

The nitride semiconductor of this kind includes a two-system type such as AlN, GaN and InN; a three-system type such as $Al_xGa_{(1-x)}N$ ($0<x<1$), $Al_xIn_{(1-x)}N$ ($0<x<1$) and $Ga_yIn_{(1-y)}N$ ($0<y<1$); and a four-system type containing all of these elements. Based on the compositions x, y and (1−x−y), the emission peak wavelength ranging from ultraviolet to blue can be determined.

Further, a part of the III group elements may be replaced by boron (B), thallium (Tl), etc. Further, a part of the V group elements may be replaced by phosphorus (P), arsenic (As), antimony (Sb), bismuth (Bi), etc.

Likewise, the II-VI group compound semiconductor to be used as a light-emitting layer includes an oxide semiconductor containing at least one metal selected from Mg and Zn. More specifically, this oxide semiconductor may be represented by $Mg_zZn_{(1-z)}$ ($0 \leq z \leq 1$) and the emission peak wavelength of ultraviolet region can be determined based on the compositions z and (1−z) of Mg and Zn, respectively.

Figure 5:
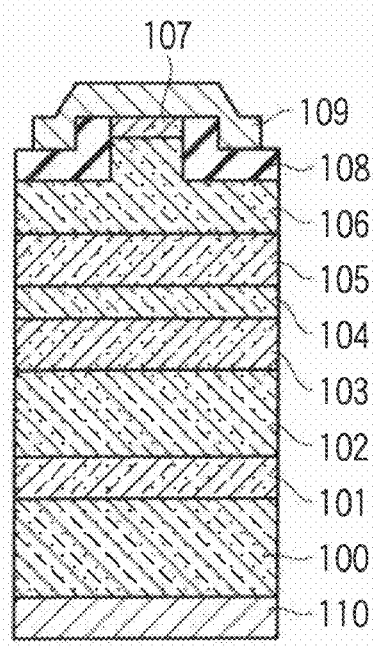
FIG. 5 is a cross-sectional view illustrating an edge-emitting type AlGaInN-based laser diode employed as a light-emitting element to be employed in the light-emitting device according to one embodiment of the present invention.

FIG. 5 shows one example of an edge-emitting type AlGaInN-based laser diode which can be employed as the light-emitting element 12. As shown in FIG. 5, this AlGaInN-based laser diode has a laminated structure including an n-type GaN substrate 100, on which an n-type GaN buffer layer 101, an n-type AlGaN cladding layer 102, an n-type GaN optical guide layer 103, a GaInN light-emitting layer 104, a p-type GaN optical guide layer 105, a p-type AlGaN cladding layer 106 and a p-type GaN contact layer 107 are successively laminated. An insulating film 108 is deposited on the ridge sidewall of the p-type GaN contact layer 107 and on the surface of the p-type AlGaN cladding layer 106. A p-type electrode 109 is formed on the surfaces of the p-type GaN contact layer 107 and of the insulating film 108. An n-side electrode 110 is attached to the underside of the n-type GaN substrate 100.

Figure 6:
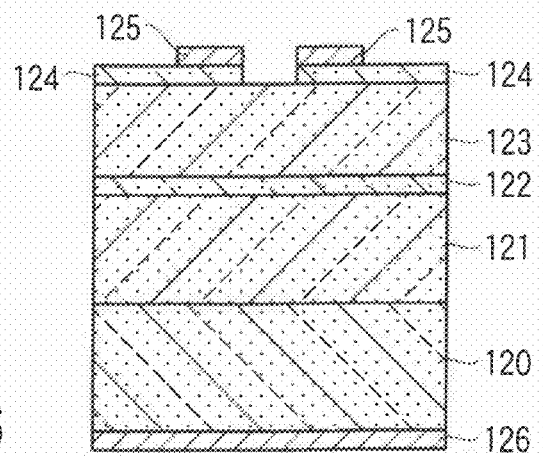
FIG. 6 is a cross-sectional view illustrating a vertical resonator-planar emission semiconductor laser diode employed as a light-emitting element to be employed in the light-emitting device according to one embodiment of the present invention.

FIG. 6 shows one example of a vertical resonator-surface emission semiconductor laser diode (VCSEL) which can be employed as the light-emitting element 12. As shown in FIG. 6, this VCSEL has a laminated structure including an n-type substrate 120, on which an n-type multi-layer film distribution Bragg's reflector (DBR) 121, a quantum well layer (MQW) 122 and a p-type multi-layer film DBR 123 are successively laminated. A p-side electrode 125 is attached, via a contact layer 124, to the surface of the p-type multi-layer film DBR 123. An n-type electrode 126 is attached to the underside of the n-type substrate 120.

Figure 7:
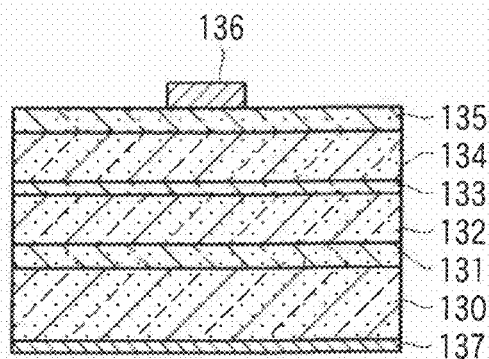
FIG. 7 is a cross-sectional view illustrating an edge-emitting type MgZnO-based laser diode employed as a light-emitting element to be employed in the light-emitting device according to one embodiment of the present invention.
Figure 8:
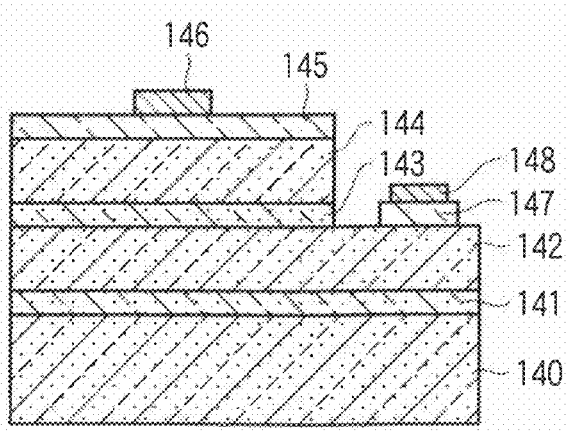
FIG. 8 is a cross-sectional view illustrating an edge-emitting type MgZnO-based laser diode employed as a light-emitting element to be employed in the light-emitting device according to one embodiment of the present invention.

FIGS. 7 and 8 illustrate respectively one example of the edge-emitting type MgZnO-based laser diode which can be employed as the light-emitting element 12. In the case of the MgZnO-based laser diode shown in FIG. 7, a silicon (Si) substrate 130 is employed. On the other hand, in case of the MgZnO-based laser diode shown in FIG. 8, a sapphire substrate 140 is employed.

The MgZnO-based laser diode shown in FIG. 7 has a laminated structure including a Si substrate 130, on which a metallic reflection layer 131, a p-type MgZnO cladding layer 132, an i-type MgZnO light-emitting layer 133, an n-type MgZnO cladding layer 134 and an n-type MgZnO contact layer 135 are successively laminated. An n-side electrode 136 is attached to the n-type contact layer 135. A p-side electrode 137 is attached to the substrate 130.

The MgZnO-based laser diode shown in FIG. 8 has a laminated structure including a sapphire substrate 140, on which a ZnO buffer layer 141, a p-type MgZnO cladding layer 142, an MgZnO light-emitting layer 143 and an n-type MgZnO cladding layer 144 are successively laminated. An n-side electrode 146 is attached, via an indium/tin oxide (ITO) electrode layer 145, to the n-type cladding layer 144. A p-side electrode 148 is attached, an ITO electrode layer 147, to the p-type MgZnO cladding layer 142.

As for the materials for the transparent medium 130 of the wavelength conversion member 14, it is possible to employ any kind of material which can be easily permeated by the excitation light and is high in heat resistance. Specific examples of such materials include, for example, silicone resin, epoxy resin, urea resin, fluorinated resin, acrylic resin, polyimide resin, etc. Especially, from the point of view of availability, easiness of handling and low cost, the epoxy resin and silicone resin may be employed. It is also possible, other than the aforementioned materials, to employ glass, a sintered body, and a ceramic structure formed of a combination of yttrium/aluminum/garnet (YAG) and alumina ($Al_2O_3$).

As for specific examples of the phosphor particles 32, it is possible to employ a material which is capable of absorbing the light of wavelength region ranging from ultraviolet to blue and capable of irradiating visible light. For example, it is possible to employ a fluorescent material such as a silicate-series fluorescent material, an aluminate-series fluorescent material, a nitride-series fluorescent material, a sulfide-series fluorescent material, an oxysulfide-series fluorescent material, a YAG-series fluorescent material, a borate-series fluorescent material, a phosphate-series fluorescent material, a halo-phosphate-series fluorescent material, etc. The following are the composition of each of these fluorescent materials.

(1) Silicate-series fluorescent material: $(Sr_{(1-x-y-z)}Ba_xCa_yEu_z)_2Si_wO_{(2+2w)}$ ($0 \leq x < 1$, $0 \leq y < 1$, $0.05 \leq z \leq 0.2$, $0.90 \leq w \leq 1.10$)

Among the silicate-series fluorescent materials represented by the aforementioned formula, it is possible to employ those having a composition where x=0.19, y=0, z=0.05, w=1.0. In order to stabilize the crystal structure and to enhance the emission intensity, part of strontium (Sr), barium (Ba) and calcium (Ca) may be replaced by Ma and/or Zn.

It is also possible to employ other kinds of silicate-series fluorescent materials having a different composition ratio from those described above. For example, it is possible to employ $MSiO_3$, $MSiO_4$, $M_2SiO_3$, $M_2SiOs$ and $M_4Si_2O_8$ (M is at least one element selected from the group consisting of Sr, Ba, Ca, Mg, Be, Zn and Y). It should be noted that for the purpose of controlling the luminescent color, part of Si may be replaced by germanium (Ge) (for example, $Sr_{(1-x-y-z)}Ba_xCa_yEu_z)_2(Si_{2(1-u)}Ge_u)O_4)$. Further, at least one of the elements selected from the group consisting of Ti, lead (Pb), manganese (Mn), arsenic (As), Al, praseodymium (Pr), terbium (Tb) and cerium (Ce) may be contained therein as an activator.

(2) Aluminate-series fluorescent material: $M_4Al_{10}O_{17}$ (M is at least one element selected from the group consisting of Ba, Sr, Mg, Zn and Ca)

Europium (Eu) and/or Mn may be contained as an activating agent.

It is also possible to employ other kinds of aluminate-series fluorescent materials having a different composition ratio from those described above. For example, it is possible to employ $MAl_2O_4$, $MAl_4O_{17}$, $MAl_8O_{13}$, $MAl_{12}O_{19}$, $M_2Al_{19}O_{17}$, $M_2Al_{11}O_{17}$, $M_3Al_5O_{12}$, $M_3Al_{16}O_{27}$ and $M_4Al_5O_{12}$ (M is at least one element selected from the group consisting of Ba, Sr, Ca, Mg, Be and Zn). Further, at least one of the elements selected from the group consisting of Mn, dysprosium (Dy), Tb, neodium (Nd) and Ce may be contained therein as an activator.

(3) Nitride-series fluorescent material (mainly, silicon nitride-series fluorescent material): $L_xSi_yN_{(2x/3+4y/3)}$:Eu or $L_xSi_yO_zN_{(2x/3+4y/3-2z/3)}$:Eu (L is at least one element selected from the group consisting of Sr, Ca, Sr and Ca)

Among the aforementioned compositions, it is possible to employ those having a composition where x=2 and y=5 or x=1 and y=7. However, the values of these x and y may be optionally selected.

With respect to specific examples of the nitride-series fluorescent material which is represented by the above formula, it is possible to employ fluorescent materials wherein Mn is added as an activating agent such as $(Sr_xCa_{(1-x)})_2Si_5N_8$:Eu, $Sr_2Si_5N_8$:Eu, $Ca_2Si_5N_8$:Eu, $Sr_xCa_{(1-x)}Si_7N_{10}$:Eu, $SrSi_7N_{10}$:Eu, $CaSi_7N_{10}$:Eu, etc. These fluorescent materials may contain at least one element selected from the group consisting of Mg, Sr, Ca, Ba, Zn, B, Al, copper (Cu), Mn, chromium (Cr) and nickel (Ni). These fluorescent materials may further contain, as an activating agent, at least one element selected from the group consisting of Ce, Pr, Tb, Nd and lanthanum (La).

(4) Sulfide-series fluorescent material: $(Zn_{(1-x)}Cd_x)S$:M (M is at least one element selected from the group consisting of Cu, chlorine (Cl), Ag, Al, iron (Fe), Cu, Ni and Zn; x is a number satisfying $0 \leq x \leq 1$)

It should be noted that sulfur (S) may be replaced by selenium (Se) and/or tellurium (Te).

(5) Oxysulfide-series fluorescent material: $(Ln_{(1-x)}Eu_x)O_2S$ (Ln is at least one element selected from the group consisting of scandium (Sc), Y, La, gadolinium (Gd) and lutetium (Lu); x is a number satisfying $0 \leq x \leq 1$)

It should be noted that at least one element selected from the group consisting of Tb, Pr, Mg, Ti, Nb, Ta, Ga, samarium (Sm) and thulium (Tm) may be contained therein as an activating agent.

(6) YAG-series fluorescent material: $(Y_{(1-x-y-z)}Gd_xLa_ySm_z)_3(Al_{(1-v)}Ga_v)_5O_{12}$:Ce,Eu ($0 \leq x \leq 1$, $0 \leq y \leq 1$, $0 \leq z \leq 1$, $0 \leq v \leq 1$,)

It should be noted that at least one element selected from Cr and Tb may be contained therein as an activating agent.

(7) Borate-series fluorescent material: $MBO_3$:Eu (M is at least one element selected from the group consisting of Y, La, Gd, Lu and In)

It should be noted that Tb may be contained therein as an activating agent.

It is also possible to employ other kinds of borate-series fluorescent materials having a different composition ratio from those described above, specific examples of which including $Cd_2B_2O_5$:Mn, (Ce, Gd, Tb)$MgB_5O_{10}$:M, $GdMgB_5O_{10}$:Ce,Tb, etc.

(8) Phosphate/borate-series fluorescent material: $2(M_{(1-x)}M'_x)O.aP_2O_5.bB_2O_3$ (M is at least one element selected from the group consisting of Mg, Ca, Sr, Ba and Zn; M' is at least one element selected from the group consisting of Eu, Mn, Sn, Fe and Cr; and x, a and b respectively represent a number satisfying $0.01 \leq x \leq 0.5$, $0 \leq a \leq 2$, $0 \leq b \leq 3$, $0.3 < (a+b)$)

(9) Phosphate-series fluorescent material: $(Sr_{(1-x)}Ba_x)_3(PO_4)_2$:Eu or $(Sr_{(1-x)}Ba_x)_2P_2O_7$:Eu,Sn It should be noted that Ti and/or Cu may be contained therein as an activating agent.

(10) Halo-phosphate-series fluorescent material: $(M_{(1-x)}Eu_x)_{10}(PO_4)_6Cl_2$ or $(M_{(1-x)}Eu_x)_5(PO_4)_3Cl$ (M is at least one element selected from the group consisting of Ba, Sr, Ca, Mg and Cd; and x is a number satisfying $0 \leq x \leq 1$)

It should be noted that at least part of Cl may be replaced by fluorine (F). Further Sb and/or Mn may be contained therein as an activating agent.

The aforementioned fluorescent materials may be optionally selected to employ them in a blue wavelength conversion member, a yellow wavelength conversion member, a green wavelength conversion member, a red wavelength conversion member or a white wavelength conversion member. Further, it is also possible to suitably combine plural kinds of fluorescent materials to form a wavelength conversion member emitting an intermediate color. If it is desired to form a white wavelength conversion member, three kinds of fluorescent materials each corresponding to three primary colors, i.e., red/green/blue (RGB), may be combined or alternatively additive complementary colors such as blue and yellow may be suitably combined to form a white wavelength conversion member.

Figure 9:
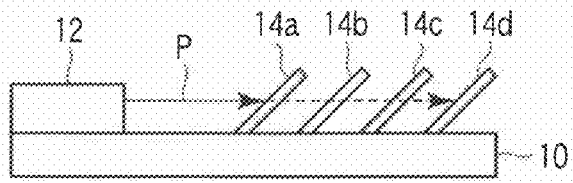
FIG. 9 is a diagram illustrating a light-emitting device according to another embodiment of the present invention.

Furthermore, these combinations of colors may be differentiated among the wavelength conversion members 14a, 14b, 14c and 14d as shown in FIG. 9. Further, on the contrary, all of these wavelength conversion members may be formed from the same wavelength conversion member constituted by mixed fluorescent materials. For example, various fluorescent materials corresponding to R,G,B may be mixed with a transparent medium to form wavelength conversion members each corresponding to R,G,B. Then, these wavelength conversion members may be suitably combined to obtain a light-emitting device which is capable of emitting white light. Alternatively, the fluorescent materials corresponding to R,G,B may be mixed into the same transparent medium to obtain a light-emitting device wherein the wavelength conversion members 14a, 14b, 14c and 14d are respectively enabled to emit white light. If it is desired to secure the stability in terms of light extracting efficiency and tint, it is possible to incorporate one kind of phosphor into each of the wavelength conversion members, thereby creating white light as a whole in the light-emitting device. On the other hand, if it is desired to attach importance to the easiness of the manufacture of wavelength conversion members, the latter structure where phosphors are incorporated into wavelength conversion members may be adopted.

It should be noted that in FIG. 9 as well as in the succeeding figures after FIG. 9, the wiring layer and the bonding wire are omitted.

As for the base 10, it is possible to employ a material which is excellent in heat conductivity. For example, it is possible to employ AlN, $Al_2O_3$, Cu, boron nitride (BN), plastics, ceramics and diamond. By making use of the base 10 made of these materials, it is possible to effectively release the heat that may be produced during the operation of the light-emitting element 12.

With respect to the wiring layers 16a and 16b, it is possible to employ a material which is low in electric resistance and also low in absorption coefficient of visible light. For example, the wiring layers 16a and 16b may be formed by making use of a metallic material such as Au, Ag, Cu, Cu alloys or tungsten (W). The wiring layers 16a and 16b may be constituted by a thin film wiring layer or a thick film wiring layer. In order to enhance the bondability, the wiring layers 16a and 16b may be provided with an Au-plating, an Ag-plating, a Pd-plating or a solder-plating. With respect to the boding wire 15, it is possible to employ a material which is low in electric resistance and also low in absorption coefficient of visible light. For example, it is possible to employ an Au wire. Alternatively, a wire formed of a combination of a noble metal such as Pt and Au may be employed.

EXAMPLES

Next, various examples of the light-emitting device according to the embodiments of the present invention discussed above will be explained as follows.

Example 1

This example relates to the manufacture of the light-emitting device shown in FIGS. 1 and 2.

First of all, the wavelength conversion members 14 of the light-emitting device shown in FIGS. 1 and 2 are formed. As for the transparent medium for the wavelength conversion member, silicone resin is used. By making use of two kinds of fluorescent materials constituting complementary colors enabling them to create white, a wavelength conversion member containing these fluorescent materials at 50 wt % respectively is formed in the transparent medium. For example, a blue wavelength conversion member containing a blue phosphor and a yellow wavelength conversion member containing a yellow phosphor are respectively formed. More specifically, $(Sr, Ca, Ba)_{10}(PO_4)_6C_{12}$:Eu is employed for the blue phosphor material and $3(Sr, Ca, Ba)_2Si_2O_4$:Eu is employed for the yellow phosphor material.

A base 10 made of AlN, etc. is manufactured by means of molding work. A metallic film formed of Au, etc. is deposited on the surface of the base 10. The metallic film thus formed is then subjected to a patterning process by making use of photolithography, etching, etc. to thereby form wiring layers 16a and 16b on the surface of the base 10.

A semiconductor laser diode having an AlGaInN light-emitting layer producing violet light is mounted, as a light-emitting element 12, on the wiring layer 16a of the base 10. Further, wavelength conversion members 14 are disposed on the surface of the base 10 in such a manner that one of the surfaces of each of the wavelength conversion members 14 obliquely faces the light-emitting element 12 at an angle of 45° to the surface of base 10. Subsequently, the wiring layer 16b is electrically connected to the electrode (not shown) of the light-emitting element 12 by making use of a bonding wire 15.

In the light-emitting device that has been manufactured as described above, an operating voltage is applied between the electrodes of the light-emitting element 12 to oscillate a laser beam. The excitation light that has been output from the light-emitting element 12 and directed toward the wavelength conversion members 14 is absorbed by each of these wavelength conversion members 14 and then white light is enabled to emit in a direction differing from the incident direction of the excitation light.

Example 2

Figure 10:
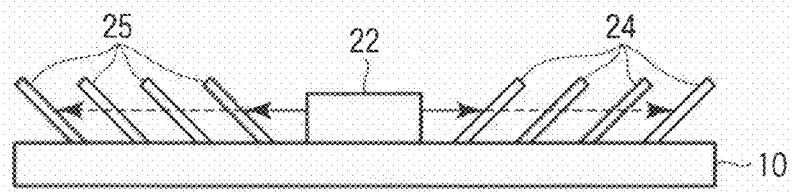
FIG. 10 is a diagram illustrating a light-emitting device according to Example 2.

This example illustrates one example wherein an edge-emitting type light-emitting element 22 is employed. Since it is possible to irradiate the excitation light from both opposing end faces in the case of the edge-emitting type light-emitting element 12, wavelength conversion members 24 are disposed to face one of the edges from which the excitation light can be irradiated and, at the same time, wavelength conversion members 25 are disposed to face the other edge as shown in FIG. 10.

The light-emitting device according to this example can be used on the occasion of concretely applying it to a practical light-emitting device.

Example 3

Figure 11:
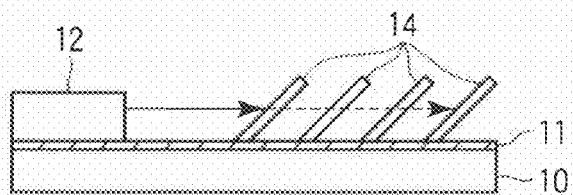
FIG. 11 is a diagram illustrating a light-emitting device according to Example 3.

This example illustrates one example wherein a reflective film 11 made of a metal, etc. is deposited on the surface of the base 10 on which the wavelength conversion members 14 are disposed as shown in FIG. 11. Among the visible light to be isotropically in the interior of wavelength conversion members 14, the visible light that has been irradiated in the direction toward the base 10 is reflected by the reflective film 11. As a result, the light extracting efficiency, in the external direction, of the visible light that has been irradiated in the interior of wavelength conversion members 14 can be enhanced.

As for the reflective film 11, it is possible to employ a metal film or a dielectric multi-layer film DBR, both exhibiting a reflectance of not less than about 80%, more preferably not less than about 90% against the excitation light. Especially, the dielectric multi-layer film DBR can be designed, for example, so as to align with the wavelength of excitation light, so that only the excitation light can be selectively reflected and the visible light is enabled to pass through the DBR.

As for the metal constituting the metal film, it is possible to employ Al, Au, Ag, Pd, etc. With respect to the dielectrics constituting the dielectric multi-layer film, it is possible to employ oxides and nitrides of Si, Zr, Hf, Al, Ta, Ti, etc.

Example 4

Figure 12:
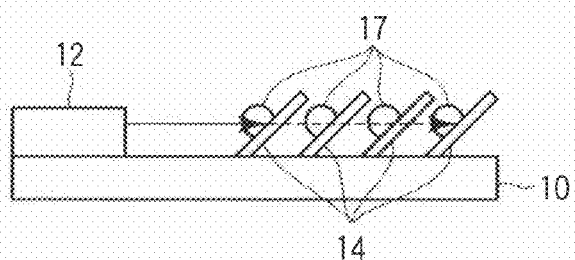
FIG. 12 is a diagram illustrating a light-emitting device according to Example 4.

This example illustrates one example wherein a antireflection member 17 for preventing the reflection of excitation light is disposed at a portion of the surface of each of the wavelength conversion members 14, to which the excitation light irradiated from the light source is spotted as shown in FIG. 12. As for the specific structure of the antireflection member 17, it may be a lens, a fine projected/recessed structure, an AR coating, etc.

Due to the existence of the antireflection member 17 disposed in this manner, the excitation light can be effectively utilized, thereby making it possible to enhance the energy efficiency of the light-emitting device.

Example 5

Figure 13:
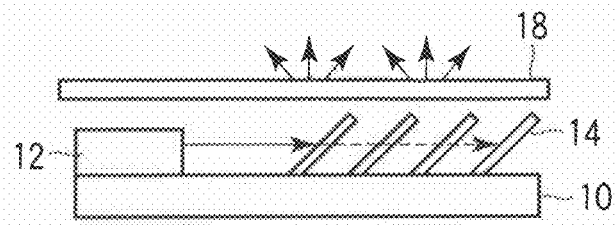
FIG. 13 is a diagram illustrating a light-emitting device according to Example 5.

This example illustrates one example wherein a diffusion plate 18 is disposed over the wavelength conversion members 14 or in a manner to entirely cover the light-emitting device as shown in FIG. 13. As for the diffusion plate 18, it is possible to employ a plastic plate or a glass plate, which is transparent to the visible light and is provided, on the surface thereof, with frosting or a lens structure. Alternatively, a light-diffusing white material may be included inside the plastic plate or the glass plate.

Although the light extracting efficiency may be deteriorated due to the provision of this diffusion plate 18 as described above, since the white light is enabled to emit from the wavelength conversion members 14, it is possible to minimize the distribution of luminance inside the light-emitting device and to obtain a uniform planar light source.

Example 6

Figure 14:
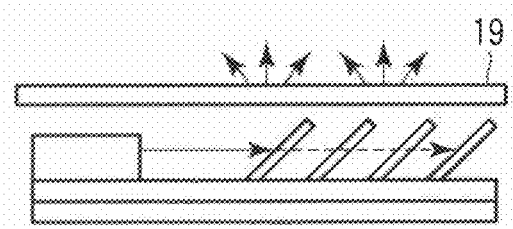
FIG. 14 is a diagram illustrating a light-emitting device according to Example 6.

This example illustrates one example wherein a UV absorption member 19 containing a phosphor is disposed over the wavelength conversion members 14 or in a manner to entirely cover the light-emitting device as shown in FIG. 14. As for the phosphor, it is possible to employ an inorganic phosphor or an organic phosphor. However, when the organic phosphor is employed, it becomes possible to minimize the UV (leakage light) and to convert the leakage light into visible light (for example, red light), thereby enhancing the effect to enhance the color rendering.

Example 7

Figure 15A:
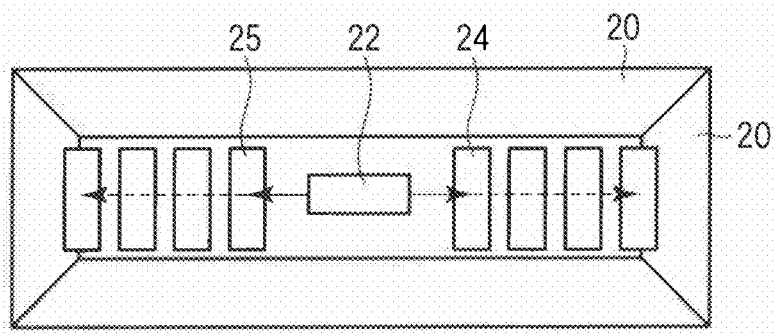
FIGS. 15A and 15B are diagrams illustrating a light-emitting device according to Example 7.
Figure 15B:
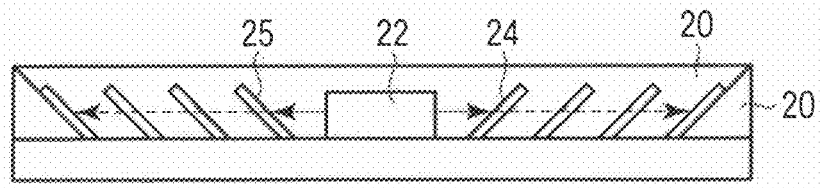

This example illustrates one example wherein a reflector 20 is disposed around the light-emitting device of Example 2 illustrated in FIG. 10 as shown in FIGS. 15A and 15B. FIG. 15A shows a top plan view and FIG. 15B shows a longitudinal sectional view of the light-emitting device.

As in the case of Example 2, the light-emitting element 12 is of an edge-emitting type, thus enabling the excitation light to emit from both opposite edges. Thus, wavelength conversion members 14 are disposed to face one of the edges from which the excitation light can be irradiated and, at the same time, wavelength conversion members 15 are disposed to face the other edge.

Due to the arrangement of the reflector 20 in a manner to surround the light-emitting device as described in this example, it is now possible to more effectively retrieve the light and to applying it to a practical light-emitting device.

Example 8

Figure 16A:
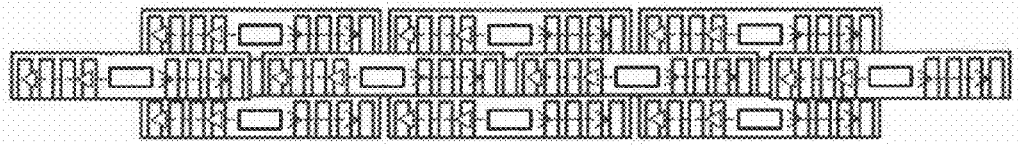
FIGS. 16A and 16B are diagrams illustrating a light-emitting device according to Example 8.
Figure 16B:
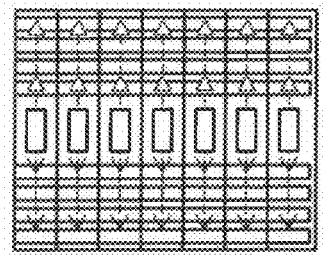

This example illustrates one example wherein a plurality of the light-emitting devices each according to Example 2 and shown in FIG. 10 are disposed as one unit as shown in FIGS. 16A and 16B. FIG. 16A shows one example wherein these light-emitting devices are arranged in series and in three rows and FIG. 16B shows another example wherein these light-emitting devices are arranged in parallel.

The unitized light-emitting device in this manner is practically suited for use as a lighting equipment.

Example 9

Figure 17A:
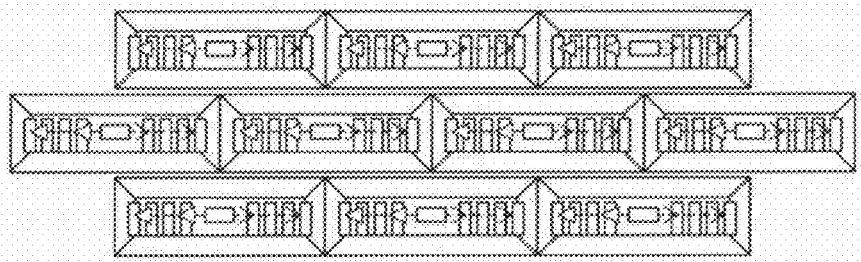
FIGS. 17A and 17B are diagrams illustrating a light-emitting device according to Example 9.
Figure 17B:
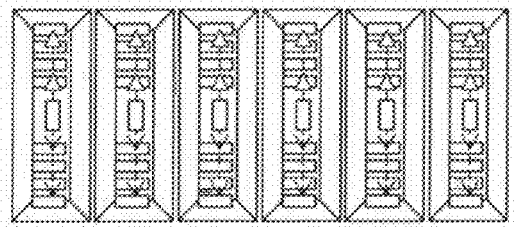

This example illustrates one example wherein a plurality of the light-emitting devices each according to Example 7 and shown in FIGS. 15A and 15B are disposed as one unit as shown in FIGS. 17A and 17B. FIG. 17A shows one example wherein these light-emitting devices are arranged in series and in three rows and FIG. 17B shows another example wherein these light-emitting devices are arranged in parallel.

The unitized light-emitting device in this manner is practically suited for use especially as a lighting equipment.

In the embodiments and examples of the present invention as described above, there are described light-emitting devices each employing a wavelength conversion member irradiating white light. However, the present invention is not limited to such light-emitting devices wherein a wavelength conversion member irradiating white light is employed but can be also applied to light-emitting devices wherein visible light of other colors can be irradiated. For example, a wavelength conversion member which is capable of irradiating red, orange, yellow, yellowish green, green, bluish green, blue, violet or white visible light may be also utilized depending on the end-use.

As for the end-use of the light-emitting device according to the present invention, it includes ordinary lighting equipments, lighting equipments for business use, back-light for a liquid crystal display apparatus of televisions or personal computers, the lighting system of motor cars, motor bicycles or bicycles, etc.

Further, the present invention is not limited to the above-described embodiments per se but constituent elements of these embodiments may be variously modified in actual use thereof without departing from the spirit of the present invention. Further, the constituent elements described in these various embodiments may be suitably combined to create various inventions. For example, some of the constituent elements described in these embodiments may be deleted. Further, the constituent elements described in different embodiments may be optionally combined with each other.

What is claimed is:

1. A light-emitting device which comprises:
   a semiconductor light-emitting element emitting an excitation light along an optical axis; and
   a plurality of plate-like wavelength conversion members which are disposed to face the semiconductor light-emitting element along the optical axis, and are inclined with respect to the optical axis, each plate-like wavelength conversion member containing a fluorescent material which is capable of absorbing the excitation light and outputting a visible light, in a light extraction direction, having a different wavelength from that of the excitation light,
   wherein the wavelength conversion members are disposed at such intervals that a brightest part of the visible light output in the light extraction direction from each wavelength conversion member is not overlapped by an adjacent wavelength conversion member.

2. The light-emitting device according to claim 1, wherein the wavelength conversion members are respectively inclined at an angle of 30° to less than 90° with respect to the optical axis of the light emitted from the semiconductor light-emitting element.

3. The light-emitting device according to claim 2, wherein the wavelength conversion members are respectively inclined at an angle of 30° to 60° with respect to the optical axis of the light emitted from the semiconductor light-emitting element.

4. The light-emitting device according to claim 3, wherein the wavelength conversion members are respectively inclined at an angle of about 45° with respect to the optical axis of the light emitted from the semiconductor light-emitting element.

5. The light-emitting device according to claim 1, wherein each of the wavelength conversion members contains plural kinds of phosphors emitting lights having different wavelengths and emits a visible light.

6. The light-emitting device according to claim 1, wherein each of the wavelength conversion members contains one kind of phosphor different from each other and emits a light having different wavelengths, and the wavelength conversion members as a whole emit a visible light.

7. The light-emitting device according to claim 1, wherein the wavelength conversion member is formed of a transparent resin containing a phosphor.

8. The light-emitting device according to claim 1, wherein the wavelength conversion member is formed of an inorganic glass or crystal containing a phosphor.

9. The light-emitting device according to claim 1, wherein the wavelength conversion member is constructed to contain a sintered body of a phosphor.

10. The light-emitting device according to claim 1, wherein the semiconductor light-emitting element is enabled to exhibit an emission peak in a wavelength region of no more than 430 nm.

11. The light-emitting device according to claim 1, wherein the semiconductor light-emitting element is formed of an edge-emitting type semiconductor laser diode or a surface emission semiconductor laser diode.

12. The light-emitting device according to claim 1, wherein the semiconductor light-emitting element comprises an emission layer containing a nitride semiconductor containing at least one metal selected from the group consisting of aluminum, gallium and indium.

13. The light-emitting device according to claim 1, wherein the semiconductor light-emitting element comprises an emission layer containing an oxide semiconductor containing at least one metal selected from the group consisting of magnesium and zinc.

* * * * *